United States Patent
Beattie et al.

(10) Patent No.: US 7,308,598 B2
(45) Date of Patent: Dec. 11, 2007

(54) ALGORITHM TO ENCODE AND COMPRESS ARRAY REDUNDANCY DATA

(75) Inventors: Irene Beattie, Leander, TX (US); Ingemar Holm, Stuttgart (DE); Mack Riley, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 439 days.

(21) Appl. No.: 10/981,156

(22) Filed: Nov. 4, 2004

(65) Prior Publication Data

US 2006/0107093 A1 May 18, 2006

(51) Int. Cl.
G06F 11/00 (2006.01)
G06F 15/76 (2006.01)
G06F 11/08 (2006.01)
G11C 29/04 (2006.01)
G11C 29/08 (2006.01)
G11C 29/00 (2006.01)

(52) U.S. Cl. .................. 714/5; 714/710; 365/200; 710/22; 711/202

(58) Field of Classification Search .............. None
See application file for complete search history.

(56) References Cited

U.S. PATENT DOCUMENTS

| 6,141,779 | A | 10/2000 | Hill et al. |
| 6,434,066 | B1 | 8/2002 | Waller et al. |
| 6,639,848 | B2 | 10/2003 | Maejima |
| 6,651,202 | B1 | 11/2003 | Phan |
| 6,747,481 | B1 | 6/2004 | Pitts |
| 7,043,672 | B2 | 5/2006 | Merritt |
| 7,053,470 | B1 | 5/2006 | Sellers et al. |
| 2004/0153900 | A1* | 8/2004 | Adams et al. .............. 714/710 |
| 2006/0294440 | A1 | 12/2006 | Riley |

FOREIGN PATENT DOCUMENTS

KR 1995-0004623 5/1995
KR 2002-0030537 4/2002

* cited by examiner

*Primary Examiner*—Hyung Sough
*Assistant Examiner*—Mardochee Chery
(74) *Attorney, Agent, or Firm*—Francis Lammes; Stephen J. Walder, Jr.; D'Ann N. Rifai

(57) ABSTRACT

A method, an apparatus and a computer program product are provided for the compression of array redundancy data. Array redundancy data can be lengthy and take up a lot of space on a processor. This invention provides an algorithm that can compress array redundancy data for storage, and decompress and reload the array redundancy data at power-on of the processor. This compression algorithm saves a lot of space on the processor, which enables the processor to save power during operation, and function more efficiently. This algorithm also skips defective array redundancy data, which can be detrimental to the processor.

18 Claims, 3 Drawing Sheets

| BIT DEFINITION | | | | DESCRIPTION | COMMAND TYPE |
|---|---|---|---|---|---|
| 0 | 1 | 2 | 3 | | |
| 0 | 0 | 0 | 0 | END OF E-FUSE DATA. | CONTROL |
| 0 | 0 | 0 | 1 | ADJUST BY 1. SHIFT ONE ZERO INTO THE RING. | ZERO |
| 0 | 0 | 1 | 0 | ADJUST BY 2. SHIFT TWO ZEROS INTO THE RING. | ZERO |
| 0 | 0 | 1 | 1 | NEXT 7 BITS SHIFTED INTO THE RING ARE ZERO. | ZERO |
| 0 | 1 | 0 | 0 | NEXT 8 BITS SHIFTED INTO THE RING ARE ZERO. | ZERO |
| 0 | 1 | 0 | 1 | NEXT 9 BITS SHIFTED INTO THE RING ARE ZERO. | ZERO |
| 0 | 1 | 1 | 0 | NEXT 7 BITS ARE ACTUAL DATA TO BE SHIFTED INTO THE RING. | ACTUAL |
| 0 | 1 | 1 | 1 | NEXT 8 BITS ARE ACTUAL DATA TO BE SHIFTED INTO THE RING. | ACTUAL |
| 1 | 0 | 0 | 0 | NEXT 9 BITS ARE ACTUAL DATA TO BE SHIFTED INTO THE RING. | ACTUAL |
| 1 | 0 | 0 | 1 | NEXT 14 BITS ARE ACTUAL DATA TO BE SHIFTED INTO THE RING. | ACTUAL |
| 1 | 0 | 1 | 0 | NEXT 16 BITS ARE ACTUAL DATA TO BE SHIFTED INTO THE RING. | ACTUAL |
| 1 | 0 | 1 | 1 | NEXT 18 BITS ARE ACTUAL DATA TO BE SHIFTED INTO THE RING. | ACTUAL |
| 1 | 1 | 0 | 0 | SKIP SHORT. SKIP BY THE NUMBER OF BITS SPECIFIED IN THE NEXT 4-BIT FIELDS. FOR SKIP, SIMPLY SHIFT THE RING. DO NOT INSERT NEW DATA. | SKIP |
| 1 | 1 | 0 | 1 | SKIP LONG. SKIP BY THE NUMBER OF BITS SPECIFIED IN THE NEXT 8-BIT FIELDS. FOR SKIP, SIMPLY SHIFT THE RING. DO NOT INSERT NEW DATA. | SKIP |
| 1 | 1 | 1 | 0 | RESUME SHIFTING THE REDUNDANCY RING STARTING WITH THE NEXT 4-BIT CODE. | CONTROL |
| 1 | 1 | 1 | 1 | CONTINUE READING E-FUSE, BUT DO NOT SHIFT REDUNDANCY RING. | CONTROL |

*FIG. 2*

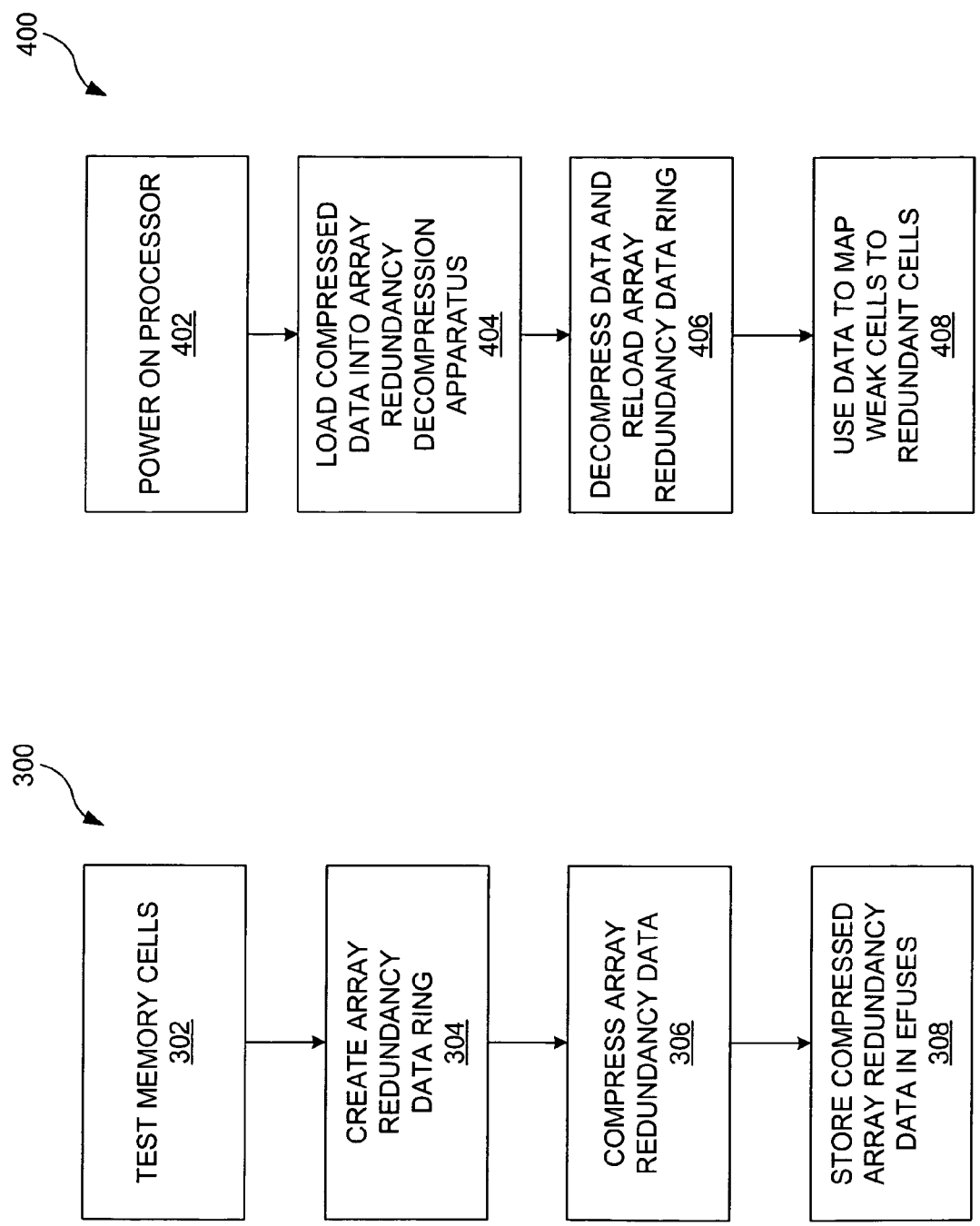

ALGORITHM TO ENCODE AND COMPRESS ARRAY REDUNDANCY DATA

FIELD OF THE INVENTION

The present invention relates generally to the storage of array redundancy data, and more particularly, to an algorithm that encodes and compresses array redundancy data.

DESCRIPTION OF THE RELATED ART

Large arrays of memory cells are designed as part of larger integrated circuits and processors. To ensure a reasonable yield, these arrays have built in spare cells (redundant cells) that may substitute for any less than perfect cells. When these large arrays are tested, it is determined which cells need to be mapped to the spare or redundant cells of the array. This information is transformed into data that is referred to as array redundancy data. The data that is required for each cell substitution is called a repair action. These repair actions are necessary to skip over the nonfunctional cells in the array, and map to the redundant cells.

These repair actions are loaded serially, one after another. Once an array tester determines the required array redundancy data or the required repair actions, this data must be reloaded at power-on of the processor. Typically, this array redundancy data is stored in an area of the device that can be programmed at test time, like laser fuses or electrical fuses (eFuses). On a large integrated circuit or processor, there is a large amount of array redundancy data that can take up large amounts of eFuses. Large numbers of eFuses occupy a large area of the device.

This is an undesirable result that impacts function and cost. If the device is larger, then more power is needed to run it. If the number of encoding fuses is compromised and the device is a reasonable size, then there is a negative impact upon the yield. In addition, since the array redundancy data is serial, if one of the eFuses is nonfunctional, and that eFuse is necessary as part of the redundancy scan data, it renders the device unusable. It is clear that a method is needed to reduce the number of eFuses that are necessary to store the redundancy data. Furthermore, a method is also needed to insure that the device is usable, even though one of the eFuses may be nonfunctional.

SUMMARY OF THE INVENTION

The present invention provides a method, an apparatus, and a computer program for the compression of array redundancy data to save area on a processor. Typically, with large arrays of memory cells in a processor there are defective cells. These defective cells must be mapped to redundant cells to permit the processor to function accurately and efficiently. The array redundancy data contains the information that maps defective cells to redundant cells. The problem is that this array redundancy data is lengthy and it is stored on the processor, which can take up a lot of space.

This invention provides an algorithm that compresses the array redundancy data, so that it can be stored in less area on the processor. Basically, the compression algorithm removes a large portion of unnecessary zeros. The array redundancy data is normally stored in eFuses on the processor, and by compressing the array redundancy data a significant amount of eFuses can be saved. Another advantage of this algorithm is that it enables the skipping of defective data. Therefore, defective eFuses, which provide defective data, are ignored and the processor remains usable. By saving space on the processor, overall power is saved and the processor operates more efficiently.

BRIEF DESCRIPTION OF THE DRAWINGS

For a more complete understanding of the present invention and the advantages thereof, reference is now made to the following descriptions taken in conjunction with the accompanying drawings, in which:

FIG. 2 is a table that describes the compression algorithm used for the modified array redundancy data ring apparatus;

FIG. 3 is a flow chart depicting the process of creating the compressed array redundancy data and storing the compressed data in the eFuses; and FIG. 4 is a flow chart depicting the process of decompressing the array redundancy data and loading it into the array redundancy data ring.

DETAILED DESCRIPTION

Figure 1:
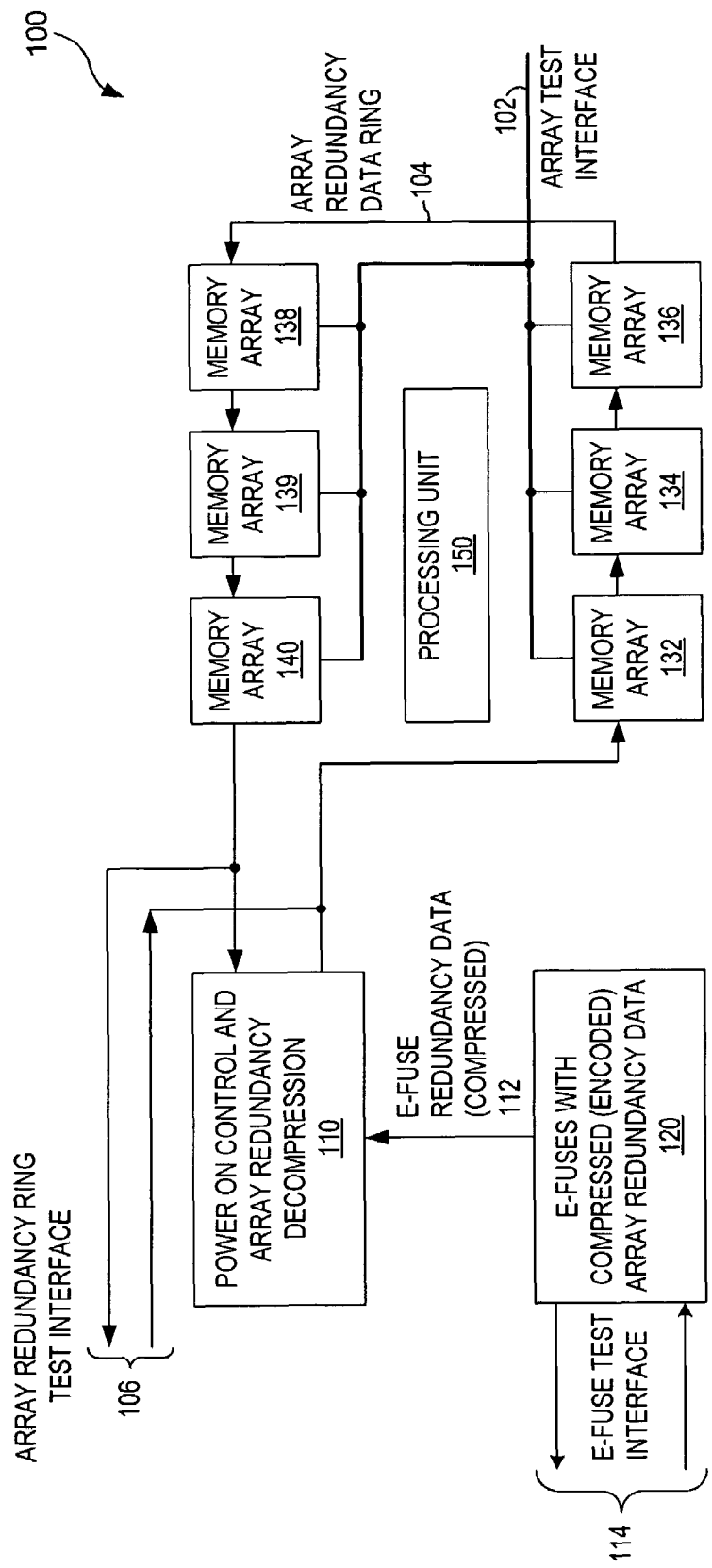
FIG. 1 is a block diagram illustrating a modified array redundancy data ring apparatus for a complex microprocessor with multiple memory arrays.

In the following discussion, numerous specific details are set forth to provide a thorough understanding of the present invention. However, those skilled in the art will appreciate that the present invention may be practiced without such specific details. In other instances, well-known elements have been illustrated in schematic or block diagram form in order not to obscure the present invention in unnecessary detail. Additionally, for the most part, details concerning network communications, electro-magnetic signaling techniques, and the like, have been omitted inasmuch as such details are not considered necessary to obtain a complete understanding of the present invention, and are considered to be within the understanding of persons of ordinary skill in the rekvant art. Furthermore, the illustrative embodiments described herein may take the form of a computer program product having a medium with a computer program embodied thereon.

To minimize a size problem, this invention encodes and compresses the redundancy data before it is stored in the eFuses. Accordingly, this data is decoded and decompressed at each time of power-on of the processor. Simultaneously, the data is loaded into the array redundancy data ring to carry out the repair actions in the array of memory cells. This allows a much smaller area of the device to be devoted to eFuses or similar devices. In addition, this invention enables nonfunctional eFuse data to be skipped during the decoding of the array redundancy data. Therefore, a nonfunctional eFuse will not render the entire device unusable.

Referring to FIG. 1 of the drawings, reference numeral 100 is a block diagram illustrating a modified array redundancy data ring apparatus for a complex microprocessor with multiple memory arrays. The processing unit 150 and the memory arrays 132, 134, 136, 138, 139, and 140 make up the microprocessor. At test time, the memory arrays 132, 134, 136, 138, 139 and 140 are tested to determine if any of the cells are nonfunctional. This process is accomplished through the array test interface 102. The testing is done on chip by build in self test logic. Test results are acquired through the array test interface 102, herein also referred to as a testing module. Analysis of the failing information is done off chip, and the end result is a determination of which memory cells need to be mapped to the spare or redundant cells. This data is referred to as the array redundancy data.

The fully decoded array redundancy data is depicted by the array redundancy data ring 104. This data is typically stored in the eFuses 120, herein also referred to as a storage module, of the device. In this invention, the eFuses 120 store the compressed (encoded) array redundancy data. The eFuse test interface 114, herein also referred to as a compression module, is used to store the compressed array redundancy data in the eFuses 120, and to test the eFuses 120 for nonfunctional eFuses that may contain defective data that needs to be skipped over.

At power-on time, the compressed array redundancy data must be decoded and reloaded into the array redundancy data ring 104 to determine which memory cells need to be mapped to the redundant cells. This process is accomplished by the power on control and array redundancy decompression apparatus 110, herein also referred to as a decompression module. The eFuse redundancy data (compressed) 112 is fed into the power on control and array redundancy decompression apparatus 110. Then this apparatus 110 decompresses the array redundancy data and loads this data into the array redundancy data ring 104. After the decompression process, the array redundancy data ring 104 contains the fully decoded array redundancy data. The array redundancy data ring 104 can be used or tested at a later time by the array redundancy ring test interface 106. The algorithm that is the core of this invention is designed to decode the compressed array redundancy data 112, and load this data into the array redundancy data ring 104. Overall, there are two data rings in this diagram. One data ring consists of the compressed array redundancy data that is stored in the eFuses 120. The other data ring is the array redundancy data ring 104, which is the fully decoded array redundancy data.

Referring to FIG. 2 of the drawings, reference numeral 200 generally indicates a table that describes the compression algorithm used for the modified array redundancy data ring apparatus. There are four major types of commands: control, shift zeros, shift actual data and skip data. There are three different control commands. The control command defined by the bit 0000 signifies the end of the eFuse data. The control command defined by the bit 1110 signifies the resumption of shifting the redundancy ring starting with the next 4-bit code. The control command defined by the bit 1111 signifies the reading of the eFuse data, but not shifting the redundancy data ring. These last two commands control the skipping of defective eFuse data. Data that is stored in a less than perfect eFuse is defective data that may render the device unusable. When the 1111 code is encountered by the decoder, eFuse data continues to be read, but the data is ignored. When the 1110 control command is encountered, the eFuse decoder resumes normal operation.

This algorithm is based upon the assumption that most of the repair actions are be unnecessary, and a reasonable amount of the redundancy data will be "0's." The nature of the repair actions are such that a "0" followed by several "0's" signifies that there is no repair action. Alternatively, a "1" followed by an address signifies a repair action. Because there are additional piping latches (for timing) between the islands on the chip there are also occasionally extra dummy latches between some of the repair actions. These extra dummy latches should be skipped over also.

The next group of commands involves shifting zeros into the array redundancy ring. The bit 0001 signifies shifting one zero into the ring, and bit 0010 signifies shifting two zeros into the ring. These commands are used to adjust the boundaries of the redundancy data using only a 4-bit command. The bit 0011 signifies shifting seven zeros into the ring, and 0100 signifies shifting eight zeros into the ring. The bit 0101 signifies shifting nine zeros into the ring. This encoding example assumes that the repair actions consist of lengths of 7, 8, and 9 bits. This is the reason that the last three commands involved shifting 7, 8, and 9 zeros into the array redundancy data ring.

The next group of commands involves shifting the actual data into the array redundancy data ring. The bit 0110 signifies shifting the next seven actual bits into the ring, and the bit 0111 signifies shifting the next eight actual bits into the ring. The bit 1000 signifies shifting the next nine bits into the ring, and the bit 1001 signifies shifting the next fourteen bits into the ring. The bit 1010 signifies shifting the next sixteen bits into the ring, and the bit 1011 signifies shifting the next eighteen bits into the ring. As previously discussed, the repair actions in this example consist of lengths of 7, 8, and 9 bits. Therefore, these commands involve shifting 7, 8, 9, 14, 16, and 18 bits into the array redundancy ring. Accordingly, a shift of 7 bits will shift one repair action into the ring, and a shift of 14 bits will shift two repair actions into the ring.

The last group of commands involves skipping bits of data from the eFuses. The bit 1100 signifies skipping by the number of bits specified in the next 4-bit fields (short skip). The bit 1101 signifies skipping by the number of bits specified in the next 8-bit fields (long skip). For both of these commands, the ring is simply shifted and no new data is inserted. The redundancy data ring is always first initialized as zero. Therefore, skipping can effectively move a larger quantity of zeros into the ring.

These four types of commands allow the compressed redundancy data to be decompressed and shifted into the array redundancy data ring. This compression algorithm is based upon both the sizes of the known repair actions and simplicity, so that it is not difficult to decode at power up time. This compression algorithm is also flexible in that the number of arrays can be added or removed on the integrated circuit or microprocessor without affecting the design/implementation of the compression algorithm. If the sizes of the repair actions for another device are different, then some of the basic zero and actual compression commands would need to be modified. Accordingly, this invention is not limited to this disclosed algorithm. This algorithm is only shown to provide an example of how the compression scheme that is the core of this invention can be implemented. An algorithm like this one drastically reduces the number of eFuses that are needed to store the array redundancy data, which saves a lot of space on the device. When less space is used on the device, power is saved and the device works more efficiently. Further, the scheme that is the core of this invention also eliminates the dependency on each and every eFuse to be perfect. An ideal device is possible, even with some nonfunctional eFuses.

Referring to FIG. 3 of the drawings, reference numeral 300 generally indicates a flow chart depicting the process of creating the array redundancy data and storing the compressed data in the eFuses. This process is completed once, while the processor or integrated circuit is being configured. The process begins with the testing of the memory cells in step 302 to determine which memory cells are defective. This step is accomplished through the array test interface 102. After this testing, process step 304 illustrates that an array redundancy data ring is created. The array redundancy data ring 104 contains the data that determines which less than perfect memory cells are mapped to the redundant cells on the wafer. Subsequently, the array redundancy data must be compressed (encoded), which is denoted by process step 306. The algorithm 200, that is the core of this invention, is used to compress (encode) the array redundancy data. The process step 306 allows the array redundancy data to occupy less area on the chip. Lastly, process step 308 depicts that the compressed array redundancy data is stored in the eFuses 120.

Referring to FIG. 4 of the drawings, reference numeral 400 generally indicates a flow chart depicting the process of decompressing the array redundancy data and loading it into the array redundancy data ring. This process is carried out every time that the processor or the integrated circuit is powered-on. The first process step 402 involves powering on the processor. Next, process step 404 illustrates that the compressed array redundancy data is loaded into the array redundancy decompression apparatus 110. Once the data is loaded, the apparatus 110 decompresses (decodes) the data and reloads the data into the array redundancy data ring 104, which is denoted as process step 406. The array redundancy data ring 104 is then used to map the less than perfect memory cells to the redundant cells on the wafer, as shown by process step 408.

It is understood that the present invention can take many forms and embodiments. Accordingly, several variations of the present design may be made without departing from the scope of the invention. The capabilities outlined herein allow for the possibility of a variety of programming models. This disclosure should not be read as preferring any particular programming model, but is instead directed to the underlying concepts on which these programming models can be built.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Many such variations and modifications may be considered desirable by those skilled in the art based upon a review of the foregoing description of preferred embodiments. Accordingly, it is appropriate that the appended claims be construed broadly and in a manner consistent with the scope of the invention.

The invention claimed is:

1. A method for managing array redundancy data for at least one large array in a processor, comprising:
    generating array redundancy data corresponding to at least one defective cell in the at least one large array;
    encoding and compressing the array redundancy data, wherein compressing the array redundancy data includes removing at least a portion of the array redundancy data that is associated with non-functional e-fuses containing defective data in order to generate compressed array redundancy data;
    decoding and decompressing the compressed array redundancy data at power-on of the processor; and
    loading decompressed array redundancy data back into the array in functional response to the decoding and decompressing.

2. The method of claim 1, wherein the step of generating array redundancy data corresponding to at least one defective cell in the at least one large array, further comprises:
    testing the at least one large array for at least one defective cell; and
    generating array redundancy data that maps over the at least one defective cell.

3. The method of claim 2, wherein the step of generating array redundancy data that maps over the at least one defective cell, further comprises generating array redundancy data that maps the at least one defective cell to at least one redundant cell.

4. The method of claim 1, wherein the step of encoding and compressing the array redundancy data, further comprises:
    storing the compressed array redundancy data.

5. The method of claim 4, wherein the step of storing the compressed array redundancy data further comprises, storing the compressed array redundancy data in at least a portion of the processor.

6. The method of claim 1, wherein the step of decoding and decompressing the encoded compressed array redundancy data at power-on of the processor, further comprises:
    accessing the compressed array redundancy data;
    skipping over defective data; and
    decoding and decompressing the compressed array redundancy data that is not defective at power-on of the processor.

7. The method of claim 1, wherein the step of loading decompressed array redundancy data back into the array in functional response to the decoding and decompressing, further comprises:
    loading the decompressed array redundancy data back into the at least one large array; and
    employing the decompressed array redundancy data to map at least one defective cell to at least one redundant cell.

8. An apparatus for managing array redundancy data for large arrays in a processor having at least one large array of memory cells, comprising:
    a testing module that is configured to test for defective memory cells in the at least one large array and to create array redundancy data;
    a compression module that is configured to compress the array redundancy data, wherein the compression module is configured to remove at least a portion of data from the array redundancy data that is associated with non-functional e-fuses containing defective data;
    a storage module that is configured to store compressed array redundancy data; and
    a decompression module that is configured to decompress the compressed array redundancy data and load decompressed array redundancy data into at least one large array.

9. The apparatus of claim 8, wherein the testing module is configured to create array redundancy data that maps at least one defective memory cell to at least one redundant cell.

10. The apparatus of claim 8, wherein the storage module is at least one laser fuse that resides on the processor.

11. The apparatus of claim 8, wherein the decompression module is configured to access the compressed array redundancy data from the storage module at power-on of the processor.

12. A computer program product for managing array redundancy data for at least one large array in a processor, with the computer program product having a storage medium with a computer program embodied thereon, wherein the computer program comprises:
    computer code for generating array redundancy data corresponding to at least one defective cell in the at least one large array;
    computer code for encoding and compressing the array redundancy data, wherein the computer code for compressing the array redundancy data includes computer code for removing at least a portion of the array redundancy data that is associated with non-functional e-fuses containing defective data in order to generate compressed array redundancy data;

computer code for decoding and decompressing the compressed array redundancy data at power-on of the processor; and computer code for loading decompressed array redundancy data back into the array in functional response to the decoding and decompressing.

13. The computer program product of claim 12, wherein the computer code for generating array redundancy data corresponding to at least one defective cell in the at least one large array, further comprises:

computer code for testing the at least one large array for at least one defective cell; and computer code for generating array redundancy data that maps over the at least one defective cell.

14. The computer program product of claim 13, wherein the computer code for generating array redundancy data that maps over the at least one defective cell, further comprises generating array redundancy data that maps the at least one defective cell to at least one redundant cell.

15. The computer program product of claim 12, wherein the computer code for encoding and compressing the array redundancy data, further comprises:

computer code for storing the compressed array redundancy data.

16. The computer program product of claim 15, wherein the step of storing the compressed array redundancy data further comprises, storing the compressed array redundancy data in at least a portion of the processor.

17. The computer program product of claim 12, wherein the step of decoding and decompressing the encoded compressed array redundancy data at power-on of the processor, further comprises:

computer code for accessing the compressed array redundancy data;

computer code for skipping over defective data; and computer code for decoding and decompressing the encoded, compressed array redundancy data that is not defective at power-on of the processor.

18. The computer program product of claim 12, wherein the step of loading decompressed array redundancy data back into the array in functional response to decoding and decompressing, further comprises:

computer code for loading the decompressed array redundancy data back into the at least one large array; and computer code for employing the decompressed array redundancy data to map at least one defective cell to at least one redundant cell.

* * * * *